(12) United States Patent
Kirita et al.

(10) Patent No.: US 11,342,528 B2
(45) Date of Patent: May 24, 2022

(54) ORGANIC ELECTROLUMINESCENT DEVICE AND METHOD OF MANUFACTURING THE SAME

(71) Applicant: JOLED INC., Tokyo (JP)

(72) Inventors: Shina Kirita, Tokyo (JP); Takayuki Shimamura, Tokyo (JP); Naoto Oda, Tokyo (JP)

(73) Assignee: JOLED INC., Tokyo (JP)

( * ) Notice: Subject to any disclaimer, the term of this patent is extended or adjusted under 35 U.S.C. 154(b) by 411 days.

(21) Appl. No.: 16/675,468

(22) Filed: Nov. 6, 2019

(65) Prior Publication Data

US 2020/0152906 A1    May 14, 2020

(30) Foreign Application Priority Data

Nov. 8, 2018 (JP) .............................. JP2018-210335

(51) Int. Cl.
*H01L 51/50* (2006.01)
*H01L 51/52* (2006.01)
*H01L 51/56* (2006.01)

(52) U.S. Cl.
CPC .......... *H01L 51/5228* (2013.01); *H01L 51/56* (2013.01); *H01L 2251/303* (2013.01); *H01L 2251/5392* (2013.01)

(58) Field of Classification Search
None
See application file for complete search history.

(56) References Cited

U.S. PATENT DOCUMENTS

2010/0117999 A1* 5/2010 Matsunaga ......... H01L 29/7869
345/204
2013/0256639 A1  10/2013 Kambe et al.

FOREIGN PATENT DOCUMENTS

JP          2013-207010          10/2013

* cited by examiner

*Primary Examiner* — Gregory D Clark
(74) *Attorney, Agent, or Firm* — Greenblum & Bernstein, P.L.C.

(57) ABSTRACT

An organic electroluminescent device includes, in order, a first electrode, a light-emitting layer, a resistive layer, and a second electrode. The resistive layer has a specific resistance within a range of $1 \times 10^4$ Ω·cm or greater and $5 \times 10^6$ Ω·m or less and includes a mixed material including two or more of zinc oxide, gallium oxide, and silicon dioxide and having a composition ratio within a predetermined range.

7 Claims, 7 Drawing Sheets

ORGANIC ELECTROLUMINESCENT DEVICE AND METHOD OF MANUFACTURING THE SAME

CROSS REFERENCE TO RELATED APPLICATIONS

This application claims the benefit of Japanese Priority Patent Application No. 2018-210335 filed on Nov. 8, 2018, the entire contents of which are incorporated herein by reference.

BACKGROUND

The disclosure relates to an organic electroluminescent device and a method of manufacturing the organic electroluminescent device.

A resistive layer which includes, for example, a metal oxide is provided between a light-emitting layer and a cathode electrode to suppress or prevent short circuiting between the anode electrode and the cathode electrode due to foreign matters, such as particles, or projections on an anode electrode in an organic electroluminescent device. Reference is made to Japanese Unexamined Patent Application Publication No. 2013-207010, for example.

SUMMARY

A resistive layer in an organic electroluminescent device can decrease in resistance during a manufacturing process, which can hinder the resistive layer from exhibiting the property that prevents short circuit between an anode electrode and a cathode electrode.

It is desirable to provide an organic electroluminescent device that maintains a property that prevents short circuiting between an anode electrode and a cathode electrode and a method of manufacturing the organic electroluminescent device.

According to one embodiment of the disclosure, there is provided an organic electroluminescent device including, in order, a first electrode, a light-emitting layer, a resistive layer, and a second electrode. The resistive layer has a specific resistance within a range of $1\times10^4$ $\Omega\cdot$cm or greater and $5\times10^6$ $\Omega\cdot$cm or less and includes a mixed material. The mixed material includes two or more of zinc oxide, gallium oxide, and silicon dioxide, and has a composition ratio within a hatched range in the diagram illustrated in FIG. 2.

According to one embodiment of the disclosure, there is provided a method of manufacturing an organic electroluminescent device. The method includes forming a first electrode; forming a light-emitting layer after the forming the first electrode; forming a resistive layer after the forming the light-emitting layer, the resistive layer including a mixed material that includes two or more of zinc oxide, gallium oxide, and silicon dioxide, the mixed material having a composition ratio within a hatched range in the diagram illustrated in FIG. 2; forming a second electrode after the forming the resistive layer; and forming, after the forming the second electrode, a protective layer using a gas containing hydrogen atoms to cause the resistive layer to have a specific resistance within a range of $1\times10^4$ $\Omega\cdot$cm or greater and $5\times10^6$ $\Omega\cdot$cm or less.

According to one embodiment of the disclosure, there is provided a method of manufacturing an organic electroluminescent device. The method includes: forming a first electrode; forming a light-emitting layer after the forming the first electrode; forming a resistive layer after the forming the light-emitting layer, the resistive layer including a mixed material that includes two or more of zinc oxide, gallium oxide, and silicon dioxide; forming a second electrode after the forming the resistive layer; and forming, after the forming the second electrode, a protective layer using a gas containing hydrogen atoms to cause the resistive layer to have a specific resistance within a range of $1\times10^4$ $\Omega\cdot$cm or greater and $5\times10^6$ $\Omega\cdot$cm or less and to cause the mixed material to have a composition ratio within a hatched range in the diagram illustrated in FIG. 2.

BRIEF DESCRIPTION OF THE DRAWINGS

The accompanying drawings are included to provide a further understanding of the technology and are incorporated in and constitute a part of this specification. The drawings illustrate example embodiments and, together with the specification, serve to explain the principles of the technology.

DETAILED DESCRIPTION

Figure 1:
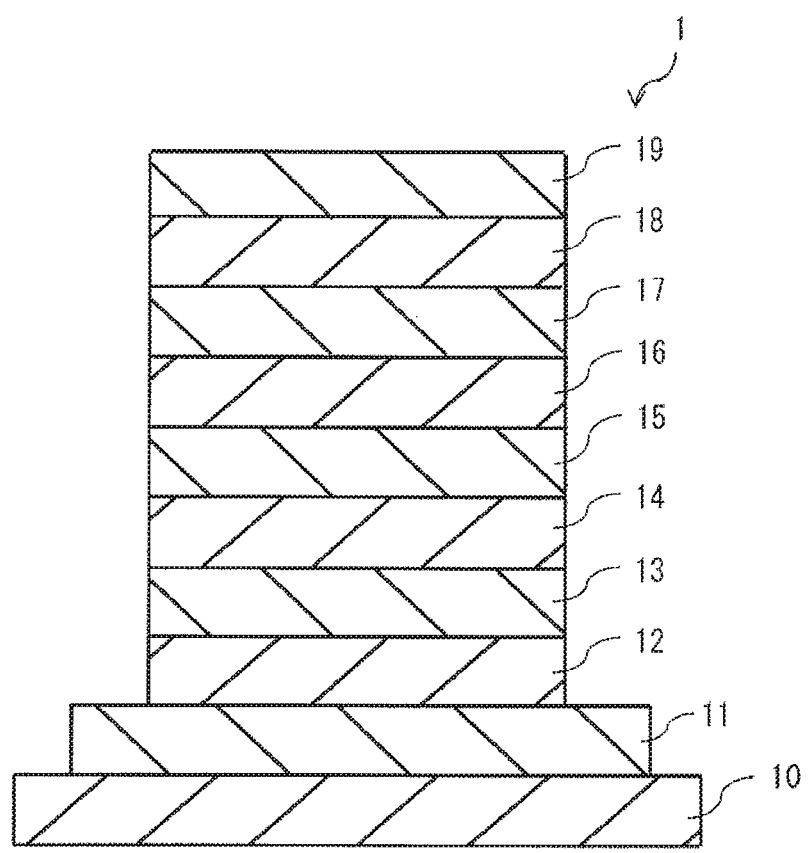
FIG. 1 is an example cross-sectional configuration of an organic electroluminescent device according to one embodiment of the disclosure.

In the following, some example embodiments of the disclosure are described in detail, in the following order, with reference to the accompanying drawings. Note that the following description is directed to illustrative examples of the disclosure and not to be construed as limiting to the disclosure. Factors including, without limitation, numerical values, shapes, materials, components, positions of the components, and how the components are coupled to each other are illustrative only and not to be construed as limiting to the disclosure. Further, elements in the following example embodiments which are not recited in a most-generic independent claim of the disclosure are optional and may be provided on an as-needed basis. The drawings are schematic and are not intended to be drawn to scale. Note that the like elements are denoted with the same reference numerals, and any redundant description thereof will not be described in detail. Note that the description is given in the following order 1. First Embodiment (Organic Electroluminescent Device)
   Example in which a resistive layer is provided between a light-emitting layer and a cathode electrode
2. Second Embodiment (Organic Electroluminescent Unit)
   Example in which an organic electroluminescent device including a resistive layer is provided in each pixel
3. Application Examples (Electronic Apparatus)

1. First Embodiment

Configuration

FIG. 1 illustrates an example cross-sectional configuration of an organic electroluminescent device 1 according to a first embodiment of the disclosure. The organic electroluminescent device 1 may be disposed on a substrate 10, for example. The organic electroluminescent device 1 includes, for example, an anode electrode 11, a cathode electrode 18, and a light-emitting layer 14 between the anode electrode 11 and the cathode electrode 18. The anode electrode 11 may correspond to a specific but non-limiting example of a first electrode according to one embodiment of the disclosure. The cathode electrode 18 may correspond to a specific but non-limiting example of a second electrode according to one embodiment of the disclosure. For example, the organic electroluminescent device 1 may further include, in order from the anode electrode 11, a hole injection layer 12 and a hole transport layer 13 between the anode electrode 11 and the light-emitting layer 14. For example, the organic electroluminescent device 1 may further include, in order from the light-emitting layer 14, an electron transport layer 15, an electron injection layer 16, and a resistive layer 17 between the light-emitting layer 14 and the cathode electrode 18. In one example, one or both of the hole injection layer 12 and the hole transport layer 13 may be omitted. In another example, one or both of the electron transport layer 15 and the electron injection layer 16 may be omitted. The resistive layer 17 may be provided at any position between the light-emitting layer 14 and the cathode electrode 18. For example, the resistive layer 17 may be provided between the light-emitting layer 14 and the electron transport layer 15, or between the electron transport layer 15 and the electron injection layer 16.

The organic electroluminescent device 1 may further include a protective layer 19 on the cathode electrode 18, for example. The organic electroluminescent device 1 may have a device structure that includes, for example, the anode electrode 11, the hole injection layer 12, the hole transport layer 13, the light-emitting layer 14, the electron transport layer 15, the electron injection layer 16, the resistive layer 17, the cathode electrode 18, and the protective layer 19 in this order from the substrate 10. Optionally, the organic electroluminescent device 1 may include additional functional layer.

The substrate 10 may be a light-transmissive substrate, such as a transparent substrate, having light transmissivity, for example. The substrate 10 may be, for example but not limited to, a glass substrate including a glass material. Alternatively, the substrate 10 may be a light-transmissive resin substrate including a light-transmissive resin material, such as a polycarbonate resin or an acrylic resin, or a thin-film transistor (TFT) which serves as a backplane of an organic electroluminescent unit.

The anode electrode 11 may be provided on the substrate 10, for example. The anode electrode 11 may be, for example but not limited to, a reflective electrode having a reflectivity. The anode electrode may include, for example, aluminum (Al), silver (Ag), or an ally of aluminum or silver. Alternatively, the anode electrode 11 may be a transparent electrode having light transmissivity, for example. Specific but non-limiting examples of the material of the transparent electrode may include a transparent electrically-conductive material, such as indium tin oxide (ITO) or indium zinc oxide (IZO). Still alternatively, the anode electrode 11 may be a laminate including an reflective electrode and a transparent electrode.

The hole injection layer 12 may enhance efficiency in injecting holes. The hole injection layer 12 may inject holes received from the anode electrode 11 to the light-emitting layer 14. The hole injection layer 12 may include an oxide of silver (Ag), molybdenum (Mo), chromium (Cr), vanadium (V), tungsten (W), nickel (Ni), or iridium (Ir), or an electrically-conductive polymeric material, such as PEDOT or a mixture of polythiophene and polystyrene sulfonate, for example. The hole injection layer 12 may have a single-layer structure or a multi-layer structure.

The hole transport layer 13 may transport holes received from the anode electrode 11 to the light-emitting layer 14. The hole transport layer 13 may include a hole transporting material that serves to transport holes received from the anode electrode 11 to the light-emitting layer 14. Specific but non-limiting examples of the hole transporting material may include an arylamine derivative, a triazole derivative, an oxadiazole derivative, an imidazole derivative, a polyarylalkane derivative, a pyrazoline derivative, a pyrazolone derivative, a phenylenediamine derivative, an amino-substituted chalcone derivative, an oxazole derivative, a styrylanthracene derivative, a fluorenone derivative, a hydrazone derivative, a stilbene derivative, a butadiene compound, a polystyrene derivative, a triphenylmethane derivative, a tetraphenylbenzene derivative, or a combination thereof.

Holes injected from the anode electrode 11 and electrons injected from the cathode electrode 18 may be coupled in the light-emitting layer 14 to generate excitons, which causes the light-emitting layer 14 to emit light. The light-emitting layer 14 may include an organic light-emitting material, for example.

The organic light-emitting material of the light-emitting layer 14 may include, for example, a host material and a dopant material in combination. Alternatively, the organic light-emitting material of the light-emitting layer 14 may include only a dopant material. The host material may serve to transport electrons or holes, and the dopant material may serve to emit light. The organic light-emitting material of the light-emitting layer 14 may include, for example but not limited to, a single host material and a single dopant material in combination. Alternatively, the organic light-emitting material of the light-emitting layer 14 may include two or more host materials and two or more dopant materials in combination.

Specific but non-limiting examples of the host material for the light-emitting layer 14 may include an amine compound, a condensed polycyclic aromatic compound, and a heterocyclic compound. Specific but non-limiting examples of the amine compound may include a monoamine derivative, a diamine derivative, a triamine derivative, and a tetraamine derivative. Specific but non-limiting examples of the condensed polycyclic aromatic compound may include an anthracene derivative, a naphthalene derivative, a naphthacene derivative, a phenanthrene derivative, a chrysene derivative, a fluoranthene derivative, a triphenylene derivative, a pentacene derivative, and a perylene derivative. Specific but non-limiting examples of the heterocyclic compound may include a carbazole derivative, a furan derivative, a pyridine derivative, a pyrimidine derivative, a triazine derivative, an imidazole derivative, a pyrazole derivative, a triazole derivative, an oxazole derivative, an oxadiazole derivative, a pyrrole derivative, an indole derivative, an azaindole derivative, an azacarbazole derivative, a pyrazoline derivative, a pyrazolone derivative, and a phthalocyanine derivative.

Specific but non-limiting examples of the dopant material for the light-emitting layer 14 may include a pyrene derivative, a fluoranthene derivative, an arylacetylene derivative, a fluorene derivative, a perylene derivative, an oxadiazole derivative, an anthracene derivative, and a chrysene derivative. Specific but non-limiting examples of the fluorescent dopant material of the light-emitting layer 14 may include a metal complex. Specific but non-limiting examples of the metal complex may include an atom of metal, such as iridium (Ir), platinum (Pt), osmium (Os), gold (Au), rhenium (Re), or ruthenium (Ru), and its ligand.

The electron transport layer 15 may serve to transport electrons received from the cathode electrode 18 to the light-emitting layer 14. The electron transport layer 15 may include, for example, an electron transporting material that serves to transport electrons received from the cathode electrode 18 to the light-emitting layer 14. The electron transport layer 15 may be a deposited film or a sputtered film, for example. The electron transport layer 15 may have a charge blocking property that blocks tunneling of electric charge (holes in this embodiment) from the light-emitting layer 14 to the cathode electrode 18 or a property that suppresses or prevents light extinction of the light-emitting layer 14 in an excited state.

The electron transporting material may include an aromatic heterocyclic compound containing one or more hetero atoms in a molecule, for example. The aromatic heterocyclic compound may contain, as a skeleton, a pyridine ring, a pyrimidine ring, a triazine ring, a benzimidazole ring, a phenanthroline ring, or a quinazoline ring, for example. Optionally, the electron transporting material may be doped with a material having an electron transporting property. In such a case, the electron transport layer 15 may be an organic electron transport layer containing a doped metal. Such an electron transport layer 15 containing the metal having the electron transporting property exhibits an enhanced electron transporting property. Specific but non-limiting examples of the metal doped in the electron transport layer 15 may include a transition metal, such as ytterbium (Yb).

The electron injection layer 16 may inject electrons received from the cathode electrode 18 to the electron transport layer 15 and the light-emitting layer 14. The electron injection layer 16 may include an electron injecting material that facilitates injection of electrons from the cathode electrode 18 to the electron transport layer 15 and the light-emitting layer 14, for example. The electron injecting material may include an organic material that has an electron injecting property and is doped with a metal having the electron injecting property. The metal doped in the electron injection layer 16 may be the same as the metal doped in the electron transport layer 15, for example.

The cathode 18 may be, for example but not limited to, a transparent electrode, such as an ITO film. Alternatively, the cathode 18 may be a reflective electrode having light reflectivity. The reflective electrode may include aluminum (Al), magnesium (Mg), silver (Ag), aluminum-lithium alloy, or magnesium-silver alloy, for example. In an example in which the substrate 10 and the anode 11 have reflectivity and the cathode 18 has light transmissivity, the organic electroluminescent device 1 may have a top-emission structure that emits light through the cathode 18. In another example in which the substrate 10 and the anode 11 have light transmissivity and the cathode 18 has reflectivity, the organic electroluminescent device 1 may have a bottom-emission structure that emits light through the substrate 10.

The protective layer 19 may be provided on the cathode 18. For example, the protective layer 19 may be in contact with an upper surface of the cathode 18. The protective layer 19 may include silicon nitride (SiN), silicon oxynitride (SiON), or silicon monoxide (SiO), for example. The protective layer 19 may be formed by chemical vapor deposition (CVD) using a gas containing hydrogen atoms, such as silane, ammonia, or disilane, for example.

The resistive layer 17 will now be described. In some cases, short circuiting can be caused between the anode electrode 11 and the cathode electrode 18 due to foreign matters, such as particles, or projections on the anode electrode 11. The resistive layer 17 may be provided to suppress or prevent the short circuiting. The resistive layer 17 may have a thickness with in a range of 30 nm or greater and 1000 nm or less, for example. The resistive layer 17 has a specific resistance within a range of $1 \times 10^4$ Ω·cm or greater and $5 \times 10^6$ Ω·cm or less. The resistive layer 17 includes a mixed material containing two or more of zinc oxide (ZnO), gallium oxide ($Ga_2O_3$), and silicon dioxide ($SiO_2$) and having a composition ratio within a hatched range in FIG. 2.

Figure 2:
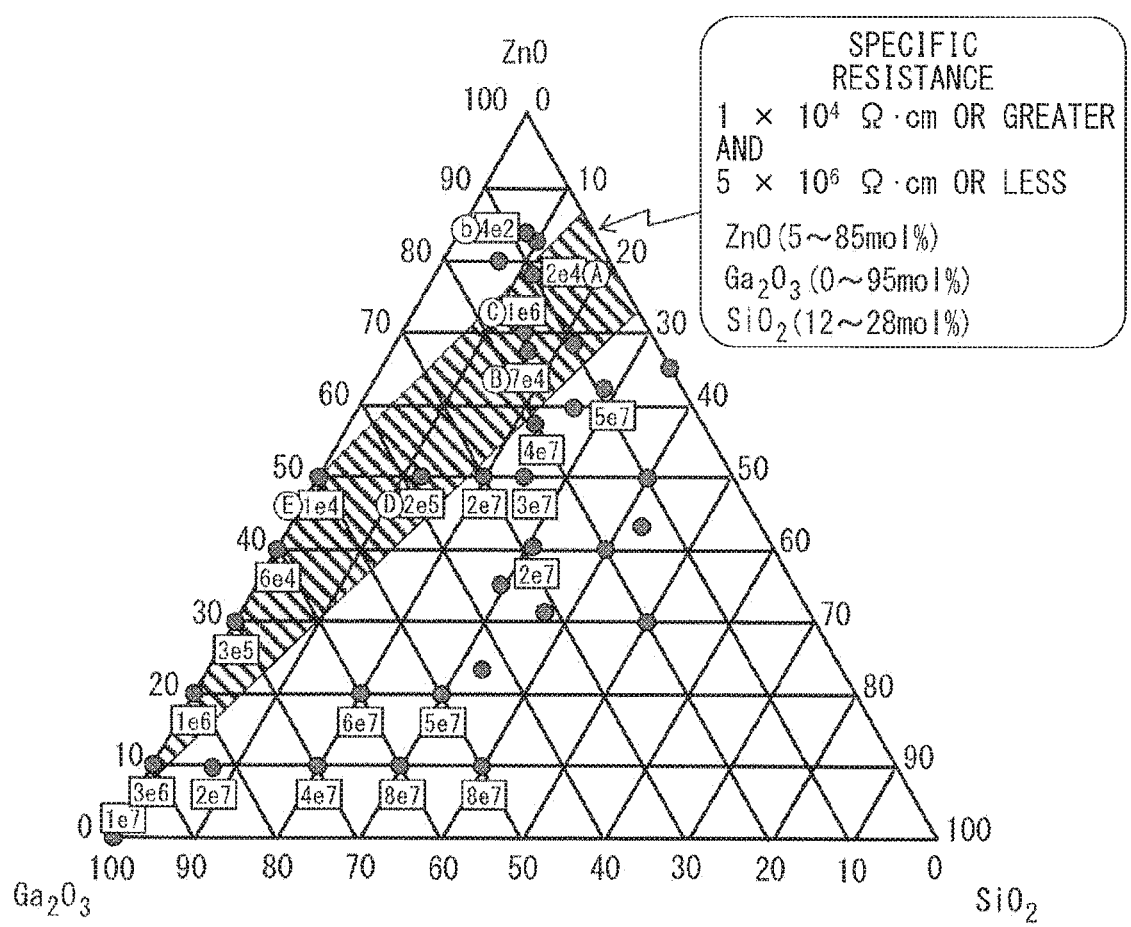
FIG. 2 is a diagram illustrating an example composition of a resistive layer illustrated in FIG. 1.

FIG. 2 illustrates an example composition of the resistive layer 17. Indicated in FIG. 2 are respective mol ratios of three materials (i.e., ZnO, $Ga_2O_3$, and $SiO_2$) of the resistive layer 17. The left side of the triangle represents the mol ratio of ZnO, the right side of the triangle represents the mol ratio of $SiO_2$, and the base of the triangle represents the mol ratio of $Ga_2O_3$. FIG. 2 illustrates the specific resistance of the resistive layer 17, which includes a mixed material containing two or more of the three materials (i.e., ZnO, $Ga_2O_3$, and $SiO_2$), measured after forming the protective layer 19 (i.e., after CVD). In the hatched range in FIG. 2, the resistive layer 17 has a specific resistance within a range of $1 \times 10^4$ Ω·cm or greater and $5 \times 10^6$ Ω·cm or less. In the hatched range in FIG. 2, the mol ratio of ZnO is within a range of 5 mol % or greater and 85 mol % or less. In the hatched range in FIG. 2, the mol ratio of $Ga_2O_3$ is within a range of 0 mol % or greater and 95 mol % or less. In the hatched range in FIG. 2, the mol ratio of $SiO_2$ is within a range of 12 mol % or greater and 28 mol % or less.

Figure 3:
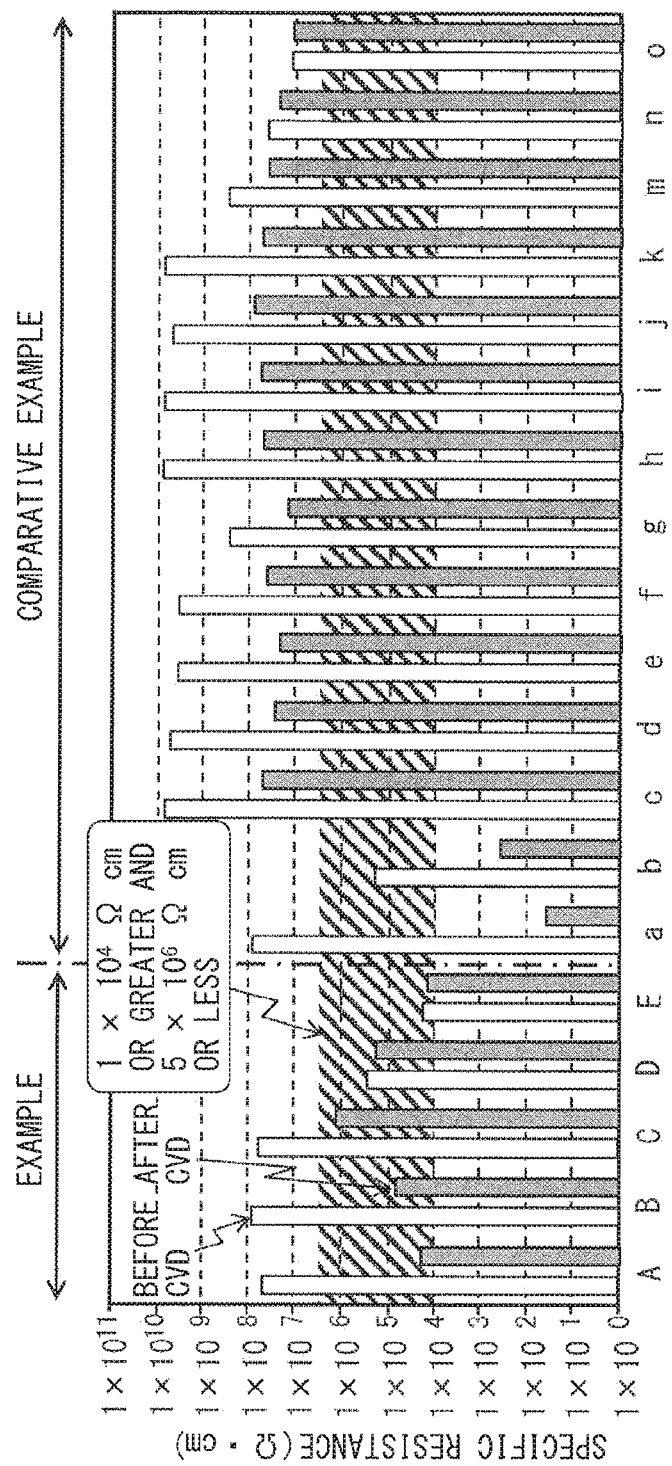
FIG. 3 is a graph illustrating specific resistances measured at respective measurement points before and after CVD illustrated in FIG. 2.
Figure 4:
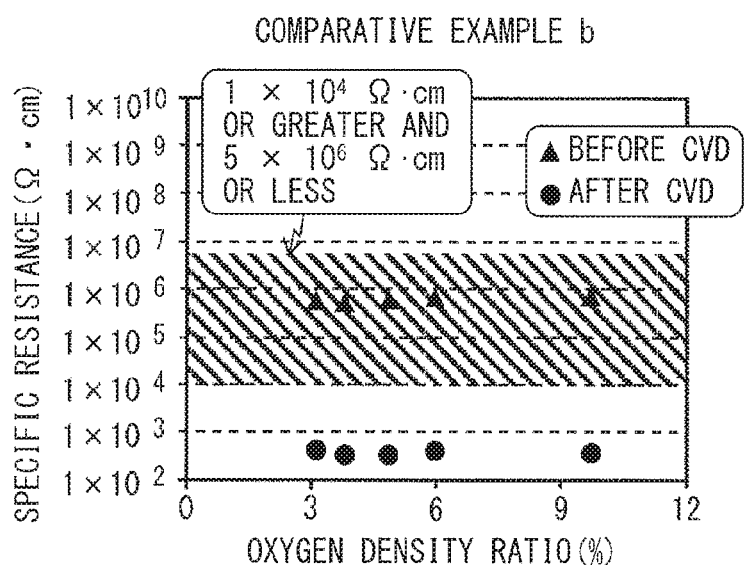
FIG. 4 is a graph illustrating the dependence of the specific resistance on an oxygen density according to Comparative Example b illustrated in FIG. 2.

FIG. 3 illustrates the specific resistances of the resistive layer 17 measured at respective measurement points (illustrated in FIG. 2) before and after the CVD. The wording "before the CVD" used herein refers to a timing after the formation of the resistive layer 17 and before the formation of the protective layer 19. The wording "after the CVD" used herein refers to a timing after the formation of the protective layer 19 on the resistive layer 17. FIG. 3 illustrates the measured specific resistances of five Examples of the resistive layer 17 that include different mixed materials. Additionally, FIG. 3 illustrates the measured specific resistances of fourteen Comparative Examples of the resistive layer including different mixed materials. It is apparent from FIG. 3 that the specific resistance of the resistive layer 17 decreases after the formation of the protective layer 19 on the resistive layer 17 (i.e., after the formation of the resistive layer 17 and the CVD). The decrease in the specific resistance of the resistive layer 17 may be caused by an influence of hydrogen ($H_2$) plasma generated during the formation of the protective layer 19 by the CVD. If the specific resistance of the resistive layer falls below a desired range (e.g., a range of $1 \times 10^4$ Ω·cm or greater and $5 \times 10^6$ Ω·cm or less), it becomes difficult for the resistive layer to effectively suppress or prevent short circuiting. If the specific resistance of the resistive layer exceeds the desired range (e.g., a range of $1 \times 10^4$ Ω·cm or greater and $5 \times 10^6$ Ω·cm or less) on the other hand, it becomes possible for the resistive layer to suppress or prevent short circuiting, but the driving voltage of the organic electroluminescent device 1 could increase with the increase in the specific resistance of the resistive layer. With reference to FIG. 4, for example, the resistive layer of Comparative Example b illustrated in FIGS. 2 and 3 has a specific resistance falling below the desired range (e.g., a range of $1 \times 10^4$ Ω·cm or greater and $5 \times 10^6$ Ω·cm or less) even though the oxygen density ratio is varied during the formation of the protective layer 19. Thus, it is not practical to apply the resistive layer of Comparative Example b to the organic electroluminescent device 1.

Figure 5:
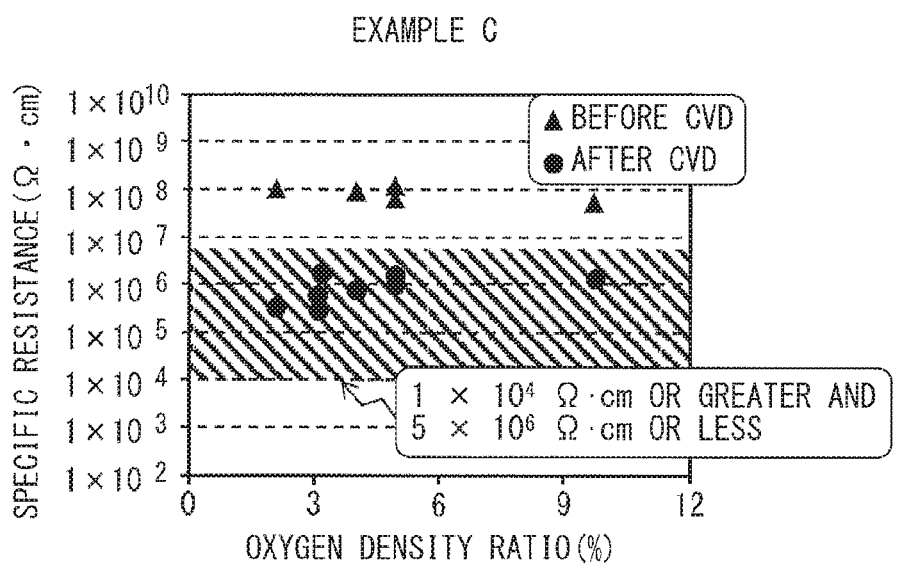
FIG. 5 is a graph illustrating the dependence of the specific resistance on the oxygen density according to Example C illustrated in FIG. 2.
Figure 6:
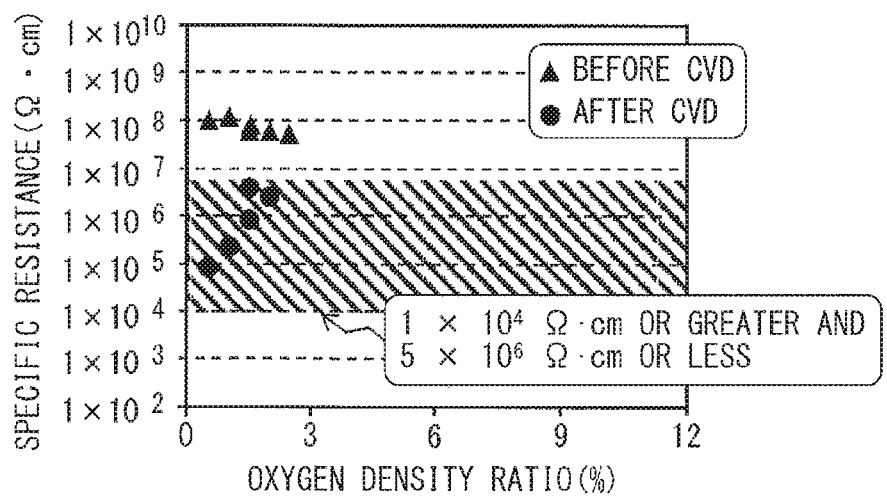
FIG. 6 is a graph illustrating the dependence of the specific resistance on the oxygen density according to Example B illustrated in FIG. 2.
Figure 7:
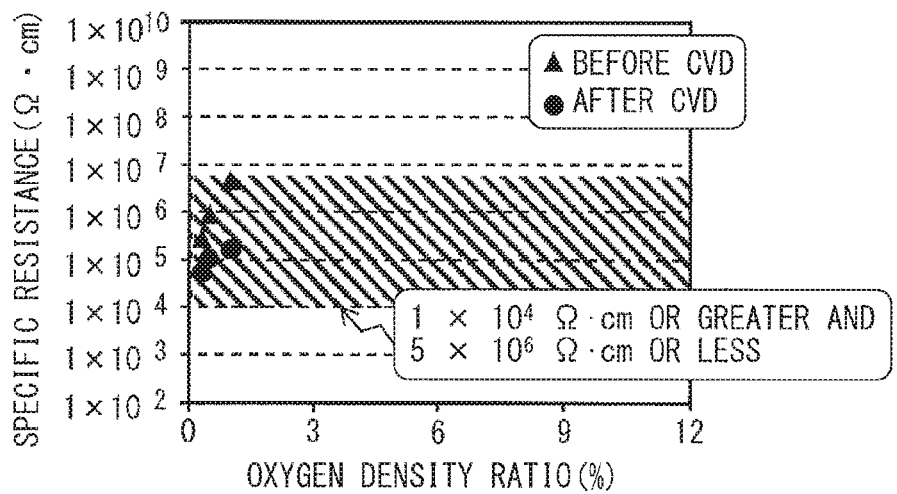
FIG. 7 is a graph illustrating the dependence of the specific resistance on the oxygen density according to Example E illustrated in FIG. 2.

In contrast, the resistive layer 17 of each of Examples has a specific resistance within the desired range (e.g., a range of $1 \times 10^4$ Ω·cm or greater and $5 \times 10^6$ Ω·cm or less) after the formation of the protective layer 19 on the resistive layer 17 (i.e., after the formation of the resistive layer 17 and the CVD). In other words, the specific resistance of the resistive layer 17 does not deviate from the desired range even after the formation of the protective layer 19 on the resistive layer 17 (i.e., even after the formation of the resistive layer 17 and the CVD). It is apparent from FIGS. 5, 6, and 7, for example, that the specific resistance of the resistive layer 17 is within the desired range (e.g., a range of $1 \times 10^4$ Ω·cm or greater and $5 \times 10^6$ Ω·cm or less) even when the oxygen density ratio is varied during the formation of the protective layer 19, in each of Examples B, C, and E illustrated in FIGS. 2 and 3. Thus, it is highly practical to apply the resistive layer 17 of any of Examples to the organic electroluminescent device 1.

Manufacturing Method

A method of manufacturing the organic electroluminescent device 1 according to the first embodiment of the disclosure will now be described.

Figure 8:
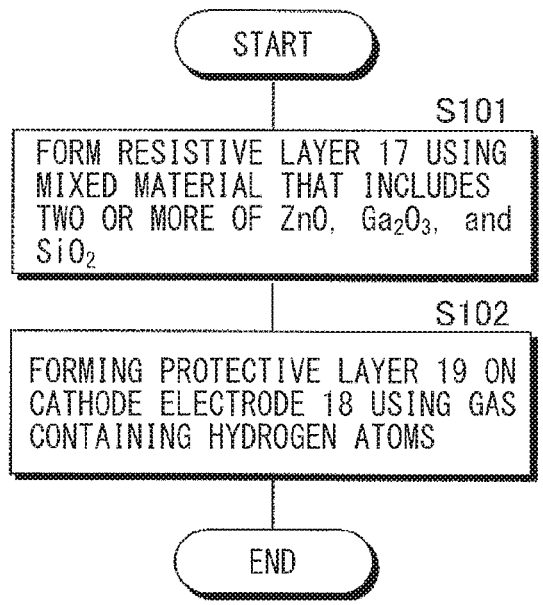
FIG. 8 is a flowchart illustrating a method of manufacturing the organic electroluminescent device illustrated in FIG. 1.

First, the anode electrode 11, the hole injection layer 12, the hole transport layer 13, the light-emitting layer 14, the electron transport layer 15, and the electron injection layer 16 may be formed on the substrate 10. Next, the resistive layer 17 that includes a mixed material containing two or more of $ZnO$, $Ga_2O_3$, and $SiO_2$ may be formed in Step S101, as illustrated in FIG. 8. The resistive layer 17 may have such a composition ratio that the specific resistance of the resistive layer 17 is within a range of $1 \times 10^4$ Ω·cm or greater and $5 \times 10^6$ Ω·cm or less. For example, the composition ratio of the mixed material of the resistive layer 17 may be within the hatched range illustrated in FIG. 2. Thereafter, the cathode electrode 18 may be formed, and the protective layer 19 may be formed by CVD using a gas containing hydrogen atoms in Step S102, as illustrated in FIG. 8. The specific resistance of the resistive layer 17 may be thereby set to a range of $1 \times 10^4$ Ω·cm or greater and $5 \times 10^6$ Ω·cm or less.

Effects

Some effects of the organic electroluminescent device 1 according to the first embodiment of the disclosure will now be described.

A resistive layer which includes, for example, a metal oxide is provided between a light-emitting layer and a cathode electrode to suppress or prevent short circuiting between the anode electrode and the cathode electrode due to foreign matters, such as particles, or projections on an anode electrode in an organic electroluminescent device. Unfortunately, the resistive layer can decrease in resistance during a manufacturing process, which can hinder the resistive layer from exhibiting the property that suppresses or prevents short circuiting between the anode electrode and the cathode electrode, as described above.

In contrast, the resistive layer 17 according to the first embodiment of the disclosure is provided between the light-emitting layer 14 and the cathode electrode 18. The resistive layer 17 includes a mixed material that contains two or more of $ZnO$, $Ga_2O_3$, and $SiO_2$ and has a composition ratio within the hatched range illustrated in FIG. 2. The resistive layer 17 has a specific resistance within a range of $1 \times 10^4$ Ω·cm or greater and $5 \times 10^6$ Ω·cm or less even after forming the protective layer 19 on the cathode electrode 18 using a gas containing hydrogen atoms in the manufacturing process. The resistive layer 17 makes it possible to maintain the property that suppresses or prevents short circuiting between the anode electrode 11 and the cathode electrode 18. Additionally, when the organic electroluminescent device 1 having the configuration described above is applied to a pixel in a light emitting panel, the light emitting panel is resistant to flickering. This improves yields and results in a cost reduction.

Further, the method of manufacturing the organic electroluminescent device 1 according to the first embodiment of the disclosure involves forming the resistive layer 17 that includes a mixed material containing two or more of $ZnO$, $Ga_2O_3$, and $SiO_2$ and having the composition ratio within the hatched range illustrated in FIG. 2. The resistive layer 17 may be provided between the light-emitting layer 14 and the cathode electrode 18. The resistive layer 17 has a specific resistance within a range of $1 \times 10^4$ Ω·cm or greater and $5 \times 10^6$ Ω·cm or less even after forming the protective layer 19 on the cathode electrode 18 by CVD using a gas containing hydrogen atoms. Accordingly, it is possible to certainly suppress or prevent short circuiting between the anode electrode 11 and the cathode electrode 18.

2. Second Embodiment

Configuration

Figure 9:
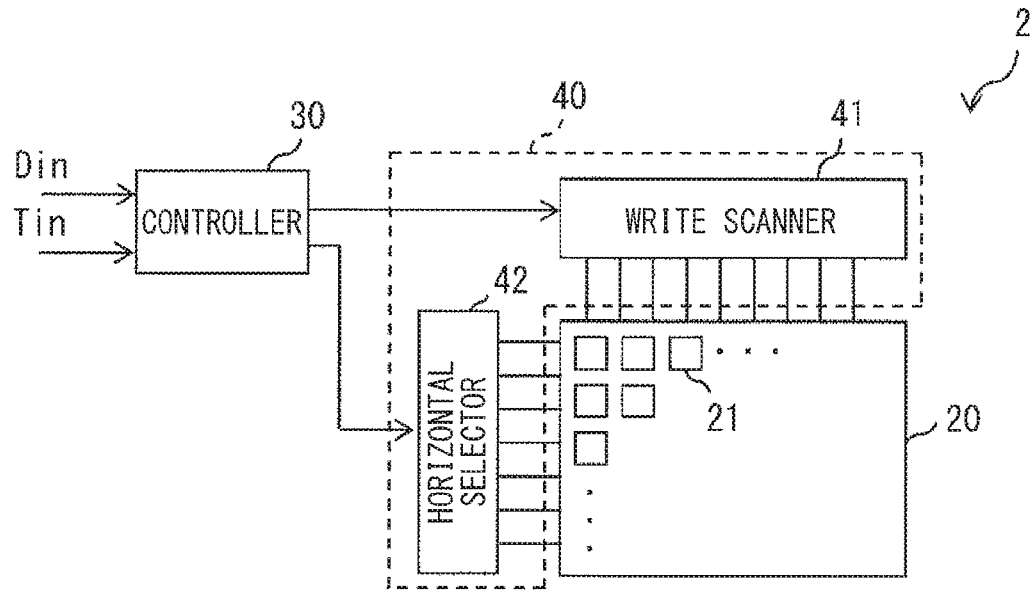
FIG. 9 is a schematic diagram of an example configuration of an organic electroluminescent unit according to one embodiment of the disclosure.
Figure 10:
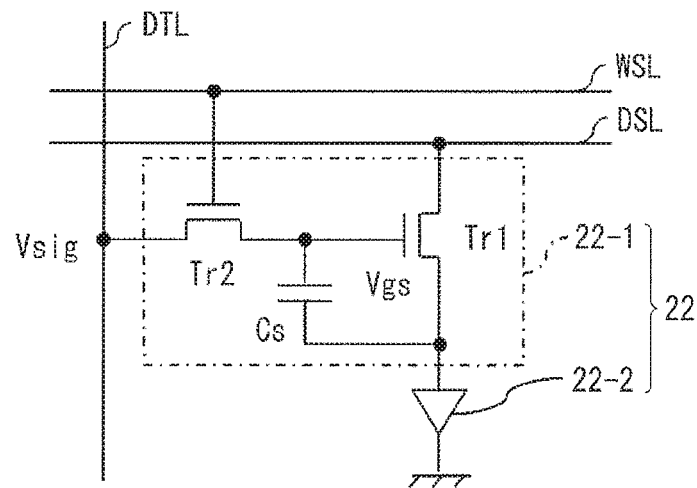
FIG. 10 is a diagram illustrating an example circuit configuration of a subpixel in each pixel illustrated in FIG. 9.

FIG. 9 schematically illustrates an example configuration of an organic electroluminescent unit 2 according to a second embodiment of the disclosure. FIG. 10 illustrates an example circuit configuration of a subpixel 22 in each pixel 21 in the organic electroluminescent unit 2. The organic electroluminescent unit 2 may include, for example, an organic electroluminescent panel 20, a controller 30, and a driver 40. The driver 40 may be mounted on an outer edge portion of the organic electroluminescent panel 20. The organic electroluminescent panel 20 may include a plurality of pixels 21 arranged in matrix. The controller 30 and the driver 40 may drive the organic electroluminescent panel 20 (i.e., the pixels 21) on the basis of an external image signal Din and an external synchronizing signal Tin.

Organic Electroluminescent Panel 20

Each of the pixels 21 of the organic electroluminescent panel 20 may be driven by the controller 30 and the driver 40 through an active matrix scheme, causing the organic electroluminescent panel 20 to display an image based on the external image signal Din and the external synchronizing signal Tin. The organic electroluminescent panel 20 may include, for example, a plurality of scanning lines WSL extending in a row direction, a plurality of signal lines DTL extending in a column direction, and a plurality of power lines DSL extending in the row direction. The organic electroluminescent panel 20 may further include the plurality of pixels 21 arranged in matrix.

The scanning lines WSL may supply the pixels 21 with a selection pulse to select the pixels 21 on a predetermined unit basis (e.g., on a pixel row basis). The signal lines DTL may supply the pixels 21 with a voltage Vsig corresponding to the image signal Din. For example, the signal lines DTL may supply the pixels 21 with a data pulse including the signal voltage Vsig. The power lines DSL may supply the pixels 21 with electric power.

The pixel 21 may include a subpixel 22 emitting red light, a subpixel 22 emitting green light, and a subpixel 22 emitting blue light, for example. Optionally, the pixel 21 may further include subpixels 22 emitting light of other colors, such as white or yellow. The subpixels 22 in the pixel 21 may be arranged in a line extending in a predetermined direction, for example.

The signal lines DTL may be each coupled to an output terminal of a horizontal selector 41 described below. Each of the signal lines DTL may be allocated to its corresponding pixel column, for example. The scanning lines WSL may be each coupled to an output terminal of a write scanner 42 described below. Each of the scanning lines WSL may be allocated to its corresponding pixel row, for example. The power lines DSL may be each coupled to an output terminal of a power. Each of the power lines DSL may be allocated to its corresponding pixel row, for example.

Each of the subpixels 22 may include a pixel circuit 22-1 and an organic electroluminescent element 22-2. The organic electroluminescent element 22-2 may correspond to the organic electroluminescent device 1 of the first embodiment.

The pixel circuit 22-1 may control light emission and light extinction of the organic electroluminescent element 22-2. The pixel circuit 22-1 may hold a voltage written into the subpixel 22 through write scanning described below. The pixel circuit 22-1 may include, for example, a driving transistor Tr1, a switching transistor Tr2, and a storage capacitor Cs.

The switching transistor Tr2 may control an application of the voltage Vsig corresponding to the image signal Din to a gate of the driving transistor Tr1. For example, the switching transistor Tr2 may sample a voltage of the signal line DTL, and may write the sampled voltage into the gate of the driving transistor Tr. The driving transistor Tr1 may be coupled in series to the organic electroluminescent element 22-2. The driving transistor Tr1 may drive the organic electroluminescent element 22-2. The driving transistor Tr1 may control an electric current flowing in the organic electroluminescent element 22-2 on the basis of the amount of the voltage sampled at the switching transistor Tr2. The storage capacitor Cs may hold a predetermined voltage between the gate and the source of the driving transistor Tr1. The storage capacitor Cs may hold the voltage Vgs between the gate and the source of the driving transistor Tr1 at a constant level during a predetermined period. Note that the pixel circuit 22-1 may have a circuit configuration including the 2Tr1C circuit described above and additional capacitors and transistors. Alternatively, the pixel circuit 22-1 may have a circuit configuration different from the 2Tr1C circuit configuration described above.

Each of the signal lines DTL may be coupled to the output terminal of the horizontal selector 41 and a source or a drain of the switching transistor Tr2. Each of the scanning lines WSL may be coupled to the output terminal of the write scanner 42 and a gate of the switching transistor Tr2. Each of the power lines DSL may be coupled to a power supply circuit and the source or drain of the driving transistor Tr1.

The gate of the switching transistor Tr2 may be coupled to the scanning line WSL. One of the source and the drain of the switching transistor Tr2 may be coupled to the signal line DTL. The other of the source and the drain, uncoupled to the signal line DTL, of the switching transistor Tr2 may be coupled to the gate of the driving transistor Tr1. One of the source and the drain of the driving transistor Tr1 may be coupled to the power line DSL. The other of the source and drain, uncoupled to the power line DSL, of the driving transistor Tr1 may be coupled to an anode electrode 11 of the organic electroluminescent element 22-2. One end of the storage capacitor Cs may be coupled to the gate of the driving transistor Tr1. The other end of the storage capacitor Cs1 may be coupled to one of the source and the drain, adjacent to the organic electroluminescent element 22-2, of the driving transistor Tr1.

Driver 40

The driver 40 may include a horizontal selector 41 and a write scanner 42, for example. The horizontal selector 41 may apply an analog signal voltage Vsig received from the controller 30 to each of the signal lines DTL in accordance with or in synchronization with a control signal. The write scanner 42 may scan the subpixels 22 on a predetermined unit basis.

Controller 30

The controller 30 will now be described. The controller 30 may perform predetermined correction of the external digital image signal Din, for example, and may generate the signal voltage Vsig on the basis of the image signal obtained through the correction. The controller 30 may output the generated signal voltage Vsig to the horizontal selector 41, for example. The controller 30 may output a control signal to each circuit in the driver 40 in response to or in synchronization with the external synchronizing signal Tin, for example.

In the second embodiment of the disclosure, the organic electroluminescent device 1 of the first embodiment may be applied to the organic electroluminescent element 22-2 in each of the subpixels 22. Thus, the resistive layer 17 in the organic electroluminescent device 1 suppresses or prevents short circuiting between the anode electrode 11 and the cathode electrode 18. Accordingly, it is possible to suppress or prevent flickering due to short circuiting in the organic electroluminescent device 1.

3. Application Examples

Some application examples of the organic electroluminescent unit 2 according to the second embodiment will now be described. The organic electroluminescent unit 2 according to the second embodiment may be applied to a display unit of various electronic apparatuses that display an image or a video image based on an external or internal image signal. Specific but non-limiting examples of the electronic apparatuses may include television apparatuses, digital cameras, notebook personal computers, sheet-type personal computers, terminal devices such as mobile phones, and video cameras.

Figure 11:
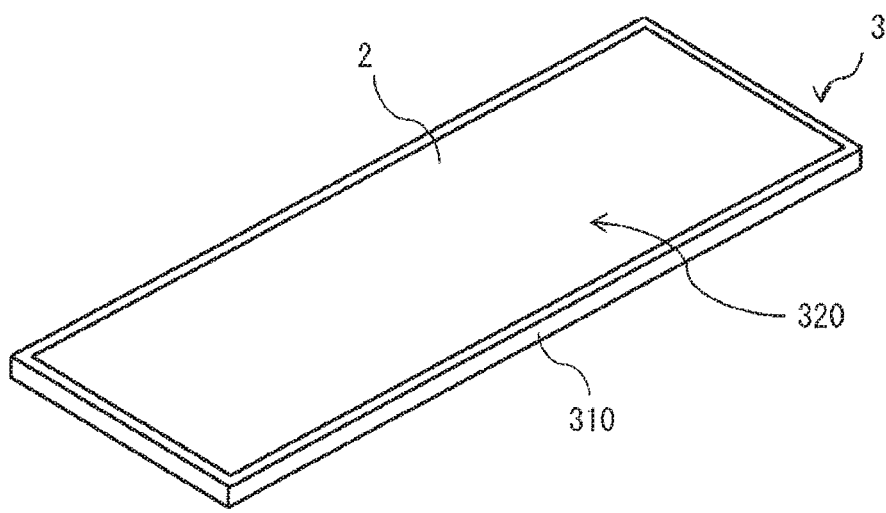
FIG. 11 is a perspective view of an example external appearance of an electronic apparatus provided with an organic electroluminescent unit according to one embodiment of the disclosure.

FIG. 11 is a schematic perspective view of an electronic apparatus 3 according to an application example. The electronic apparatus 3 may be a sheet-type personal computer having a display surface 320 on a main face of a body 310. The electronic apparatus 3 may include the organic electroluminescent unit 2 of the second embodiment on the display surface 320 of the electronic apparatus 3. The organic electroluminescent unit 2 according to the second embodiment may be disposed such that the organic electroluminescent panel 20 faces outward. According to the application example in which the organic electroluminescent unit 2 of the second embodiment is disposed on the display surface 320, it is possible to achieve the electronic apparatus 3 that is resistant to flickering due to short circuiting in the organic electroluminescent device 1.

Although the disclosure is described with reference to the example embodiments and the application examples hereinabove, these example embodiments and application examples are not to be construed as limiting the scope of the disclosure and may be modified in a wide variety of ways. It should be appreciated that the effects described herein are mere examples. Effects of the example embodiment and application examples of the disclosure are not limited to those described herein, and may be different from those described herein. The disclosure may further include any effects other than those described herein.

It is possible to achieve at least the following configurations from the above-described example embodiments of the disclosure.

(1) An organic electroluminescent device including, in order, a first electrode; a light-emitting layer; a resistive layer; and a second electrode, the resistive layer having a specific resistance within a range of $1 \times 10^4$ Ω·cm or greater and $5 \times 10^6$ Ω·cm or less and including a mixed material, the mixed material including two or more of zinc oxide, gallium oxide, and silicon dioxide and having a composition ratio within a hatched range in the diagram illustrated in FIG. 2.

(2) The organic electroluminescent device according to (1), wherein the resistive layer has a thickness within a range of 30 nm or greater and 1000 nm or less.

(3) The organic electroluminescent device according to (1), further including a protective layer disposed on a face of the second electrode, the face of the second electrode being remote from the resistive layer, the protective layer being formed using a gas containing hydrogen atoms.

(4) The organic electroluminescent device according to (3), wherein the protective layer includes silicon nitride, silicon oxynitride, or silicon monoxide.

(5) A method of manufacturing an organic electroluminescent device, the method including forming a first electrode; forming a light-emitting layer after the forming the first electrode; forming a resistive layer after the forming the light-emitting layer, the resistive layer including a mixed material that includes two or more of zinc oxide, gallium oxide, and silicon dioxide, the mixed material having a composition ratio within a hatched range in the diagram illustrated in FIG. 2; forming a second electrode after the forming the resistive layer; and forming, after the forming the second electrode, a protective layer using a gas containing hydrogen atoms to cause the resistive layer to have a specific resistance within a range of $1 \times 10^4$ Ω·m or greater and $5 \times 10^6$ Ω·cm or less.

(6) A method of manufacturing an organic electroluminescent device, the method including forming a first electrode; forming a light-emitting layer after the forming the first electrode; forming a resistive layer after the forming the light-emitting layer, the resistive layer including a mixed material that includes two or more of zinc oxide, gallium oxide, and silicon dioxide; forming a second electrode after the forming the resistive layer; and forming, after the forming the second electrode, a protective layer using a gas containing hydrogen atoms to cause the resistive layer to have a specific resistance within a range of $1 \times 10^4$ Ω·cm or greater and $5 \times 10^6$ Ω·cm or less and to cause the mixed material to have a composition ratio within a hatched range in the diagram illustrated in FIG. 2.

(7) The method according to (6), wherein the forming the resistive layer includes setting the composition ratio of the mixed material to a predetermined ratio to cause the resistive layer to have a specific resistance of within a range of $1 \times 10^4$ Ω·cm or greater and $5 \times 10^6$ Ω·cm or less after the forming the protective layer.

The organic electroluminescent device according to at least one of the foregoing embodiments of the disclosure includes the resistive layer provided between the light-emitting layer and the second electrode. The resistive layer includes the mixed material containing two or more of ZnO, $Ga_2O_3$, and $SiO_2$ and has the composition ratio within the hatched range in FIG. 2. The resistive layer has a specific resistance within a range of $1 \times 10^4$ Ω·cm or greater and $5 \times 10^6$ Ω·cm or less even after forming the protective layer on the second electrode using a gas containing hydrogen atoms in the manufacturing process.

The method of manufacturing the organic electroluminescent device according to at least one of the foregoing embodiments of the disclosure involves forming the resistive layer that includes the mixed material containing two or more of ZnO, $Ga_2O_3$, and $SiO_2$ and having the composition ratio within the hatched range in FIG. 2. The resistive layer may be provided between the light-emitting layer and the second electrode. The resistive layer has a specific resistance within a range of $1 \times 10^4$ Ω·cm or greater and $5 \times 10^6$ Ω·cm or less even after forming the protective layer on the second electrode using a gas containing hydrogen atoms.

For the organic electroluminescent device and the method of manufacturing the organic electroluminescent device according to at least one of the foregoing embodiments of the disclosure, the resistive layer has a specific resistance within a range of $1 \times 10^4$ Ω·cm or greater and $5 \times 10^6$ Ω·cm or less even after forming the protective layer on the second electrode using a gas containing hydrogen atoms. Accordingly, it is possible for the protective layer to maintain the property that suppresses or prevents short circuiting between the anode electrode and the cathode electrode. Note that the effects of the example embodiments of the disclosure are not necessarily limited to those described herein and may be any effects described herein.

Although the disclosure is described hereinabove in terms of example embodiments and application examples, it is not limited thereto. It should be appreciated that variations may be made in the example embodiments and application examples described herein by persons skilled in the art without departing from the scope of the disclosure as defined by the following claims. The limitations in the claims are to be interpreted broadly based on the language employed in the claims and not limited to examples described in this specification or during the prosecution of the application, and the examples are to be construed as non-exclusive. For example, in this disclosure, the use of the terms first, second, etc. do not denote any order or importance, but rather the terms first, second, etc., are used to distinguish one element from another. The term "disposed on/provided on/formed on" and its variants as used herein refer to elements disposed directly in contact with each other or indirectly by having intervening structures therebetween. Moreover, no element or component in this disclosure is intended to be dedicated to the public regardless of whether the element or component is explicitly recited in the following claims.

What is claimed is:

1. An organic electroluminescent device comprising, in order:
    a first electrode;
    a light-emitting layer;
    a resistive layer; and
    a second electrode,
    the resistive layer having a specific resistance within a range of $1\times10^4$ $\Omega$·cm or greater and $5\times10^6$ $\Omega$·cm or less and including a mixed material, the mixed material including two or more of zinc oxide, gallium oxide, and silicon dioxide and having a composition ratio,
    wherein a concentration of ZnO is in a range of 5 to 85 mol %, a concentration of $Ga_2O_3$ is in a range of 0 to 95 mol %, and a concentration of $SiO_2$ is in a range of 12 to 28 mol %.

2. The organic electroluminescent device according to claim 1, wherein the resistive layer has a thickness within a range of 30 nm or greater and 1000 nm or less.

3. The organic electroluminescent device according to claim 1, further comprising a protective layer disposed on a face of the second electrode, the face of the second electrode being remote from the resistive layer, the protective layer being formed using a gas containing hydrogen atoms.

4. The organic electroluminescent device according to claim 3, wherein the protective layer includes silicon nitride, silicon oxynitride, or silicon monoxide.

5. A method of manufacturing an organic electroluminescent device, the method comprising:
    forming a first electrode;
    forming a light-emitting layer after the forming the first electrode;
    forming a resistive layer after the forming the light-emitting layer, the resistive layer including a mixed material that includes two or more of zinc oxide, gallium oxide, and silicon dioxide, the mixed material having a composition ratio,
    wherein a concentration of ZnO is in a range of 5 to 85 mol %, a concentration of $Ga_2O_3$ is in a range of 0 to 95 mol %, and a concentration of $SiO_2$ is in a range of 12 to 28 mol %;
    forming a second electrode after the forming the resistive layer; and
    forming, after the forming the second electrode, a protective layer using a gas containing hydrogen atoms to cause the resistive layer to have a specific resistance within a range of $1\times10^4$ $\Omega$·cm or greater and $5\times10^6$ $\Omega$·cm or less.

6. A method of manufacturing an organic electroluminescent device, the method comprising:
    forming a first electrode;
    forming a light-emitting layer after the forming the first electrode;
    forming a resistive layer after the forming the light-emitting layer, the resistive layer including a mixed material that includes two or more of zinc oxide, gallium oxide, and silicon dioxide;
    forming a second electrode after the forming the resistive layer; and
    forming, after the forming the second electrode, a protective layer using a gas containing hydrogen atoms to cause the resistive layer to have a specific resistance within a range of $1\times10^4$ $\Omega$·cm or greater and $5\times10^6$ $\Omega$·cm or less and to cause the mixed material to have a composition ratio,
    wherein a concentration of ZnO is in a range of 5 to 85 mol %, a concentration of $Ga_2O_3$ is in a range of 0 to 95 mol %, and a concentration of $SiO_2$ is in a range of 12 to 28 mol %.

7. The method according to claim 6, wherein the forming the resistive layer includes setting the composition ratio of the mixed material to a predetermined ratio to cause the resistive layer to have a specific resistance of within a range of $1\times10^4$ $\Omega$·cm or greater and $5\times10^6$ $\Omega$·cm or less after the forming the protective layer.

* * * * *